(12) United States Patent
Chong

(10) Patent No.: US 12,142,717 B2
(45) Date of Patent: Nov. 12, 2024

(54) LIGHT EMITTING DIODE STRUCTURE AND METHOD FOR MANUFACTURING THE SAME

(71) Applicant: Raysolve Optoelectronics (Suzhou) Company Limited, Suzhou (CN)

(72) Inventor: Wing Cheung Chong, Hong Kong (CN)

(73) Assignee: Raysolve Optoelectronics (Suzhou) Company Limited, Suzhou (CN)

( * ) Notice: Subject to any disclaimer, the term of this patent is extended or adjusted under 35 U.S.C. 154(b) by 725 days.

(21) Appl. No.: 17/177,827

(22) Filed: Feb. 17, 2021

(65) Prior Publication Data

US 2021/0320234 A1 Oct. 14, 2021

Related U.S. Application Data

(60) Provisional application No. 63/007,831, filed on Apr. 9, 2020.

(51) Int. Cl.
*H01L 33/62* (2010.01)
*H01L 25/075* (2006.01)
(Continued)

(52) U.S. Cl.
CPC .......... *H01L 33/62* (2013.01); *H01L 33/0093* (2020.05); *H01L 33/0095* (2013.01);
(Continued)

(58) Field of Classification Search
CPC ..................... H01L 33/385; H01L 25/0753
See application file for complete search history.

(56) References Cited

U.S. PATENT DOCUMENTS 10,177,127 B2   1/2019 Zhang et al.
2009/0242910 A1  10/2009 Murofushi et al.
(Continued)

FOREIGN PATENT DOCUMENTS

CN   101908534 A   12/2010
CN   107170773 A    9/2017
(Continued)

OTHER PUBLICATIONS

International Search Report in corresponding PCT Application No. PCT/CN2021/083173 dated Jul. 1, 2021 (3 pages).
(Continued)

*Primary Examiner* — Antonio B Crite
(74) *Attorney, Agent, or Firm* — Nitin Kaushik

(57) ABSTRACT

A LED structure includes a substrate, a bonding layer, a first doping type semiconductor layer, a multiple quantum well (MQW) layer, a second doping type semiconductor layer, a passivation layer and an electrode layer. The bonding layer is formed on the substrate, and the first doping type semiconductor layer is formed on the bonding layer. The MQW layer is formed on the first doping type semiconductor layer, and the second doping type semiconductor layer is formed on the MQW layer. The second doping type semiconductor layer includes an isolation material made through implantation, and the passivation layer is formed on the second doping type semiconductor layer. The electrode layer is formed on the passivation layer in contact with a portion of the second doping type semiconductor layer through a first opening on the passivation layer.

15 Claims, 14 Drawing Sheets

(51) Int. Cl.
  *H01L 25/16*  (2023.01)
  *H01L 33/00*  (2010.01)
  *H01L 33/04*  (2010.01)
  *H01L 33/38*  (2010.01)
  *H01L 33/54*  (2010.01)

(52) U.S. Cl.
  CPC ............ *H01L 33/04* (2013.01); *H01L 33/382* (2013.01); *H01L 33/54* (2013.01); *H01L 2933/005* (2013.01); *H01L 2933/0066* (2013.01)

(56) References Cited

U.S. PATENT DOCUMENTS

| | | | |
|---|---|---|---|
| 2011/0263054 A1* | 10/2011 | Yu .................... | H01L 33/145 438/34 |
| 2019/0115334 A1 | 4/2019 | Zhang et al. | |
| 2020/0083402 A1 | 3/2020 | Henry et al. | |
| 2021/0013186 A1* | 1/2021 | Chen ................ | H01L 25/0753 |
| 2021/0118944 A1* | 4/2021 | Han .................. | H01L 33/0095 |

FOREIGN PATENT DOCUMENTS

| | | | | |
|---|---|---|---|---|
| CN | 110957399 A | | 4/2020 | |
| EP | 1126526 A2 * | | 8/2001 | ............. B82Y 20/00 |

OTHER PUBLICATIONS

Supplemental European Search Report in related European Application No. EP21785195, dated Sep. 7, 2023 (2 pages).

\* cited by examiner

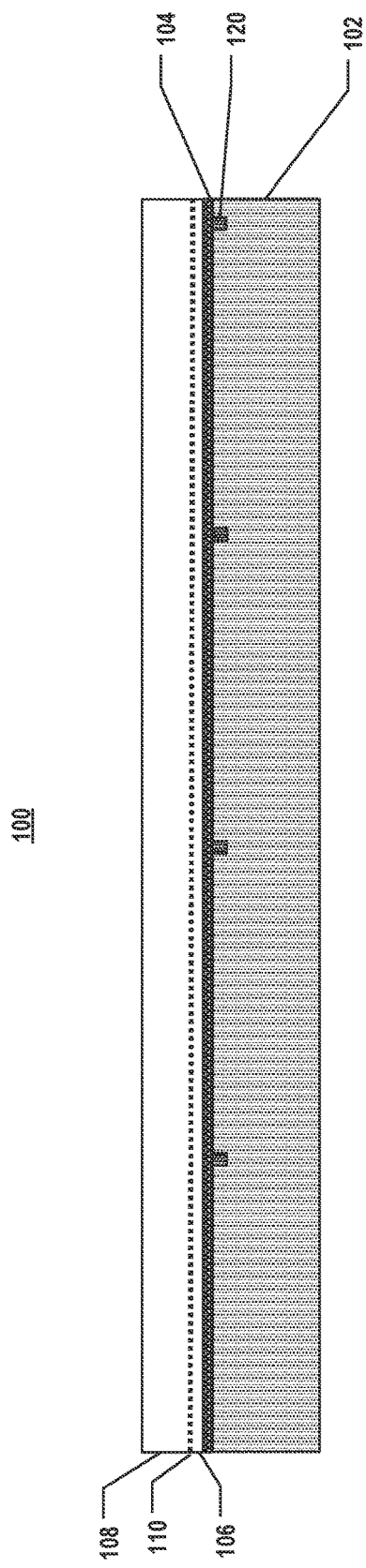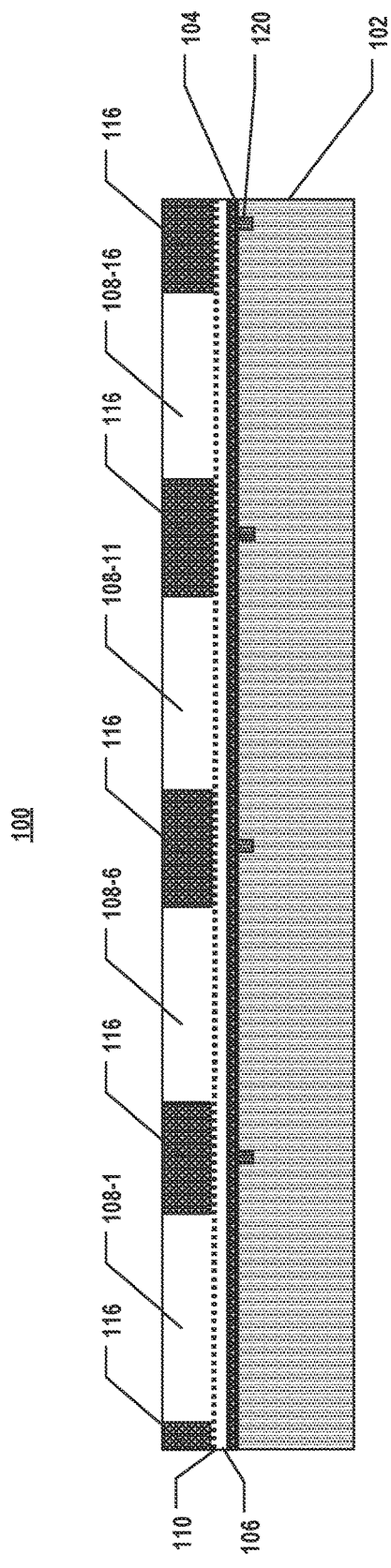

800

- 802 Forming a semiconductor layer on a first substrate, the semiconductor layer comprising a first doping type semiconductor layer, a multiple quantum well (MQW) layer on the first doping type semiconductor layer, and a second doping type semiconductor layer on the MQW layer

- 804 Performing an implantation operation to form an ion-implanted material in the second doping type semiconductor layer

- 806 Performing a first etching operation to remove at least a portion of the ion-implanted material, a portion of the MQW layer, a portion of the first doping type semiconductor layer and a portion of the bonding layer to expose a contact of a driving circuit formed in the first substrate

- 808 Forming a passivation layer on the second doping type semiconductor layer

- 810 Forming a first opening on the passivation layer exposing a portion of the second doping type semiconductor layer and a second opening on the passivation layer exposing the contact

- 812 Forming an electrode layer on the passivation layer covering the first opening and the second opening

FIG. 8

LIGHT EMITTING DIODE STRUCTURE AND METHOD FOR MANUFACTURING THE SAME

CROSS-REFERENCE TO RELATED APPLICATION

This application claims the benefit of priority of U.S. Provisional Application No. 63/007,831, filed on Apr. 9, 2020, entitled "Ion-implanted Micro-LEDs," the content of which is incorporated herein by reference in its entirety.

TECHNICAL FIELD

The present disclosure relates to a light emitting diode (LED) structure and a method for manufacturing the LED structure, and more particularly, to a LED structure with a plurality of LED units surrounded by an isolation layer and the method for manufacturing the same.

BACKGROUND

In the recent years, LEDs have become popular in lighting applications. As light sources, LEDs have many advantages including higher light efficiency, lower energy consumption, longer lifetime, smaller size, and faster switching.

Displays having micro-scale LEDs are known as micro-LED. Micro-LED displays have arrays of micro-LEDs forming the individual pixel elements. A pixel may be a minute area of illumination on a display screen, one of many from which an image is composed. In other words, pixels may be small discrete elements that together constitute an image as on a display. Pixels are normally arranged in a two-dimensional (2D) matrix, and are represented using dots, squares, rectangles, or other shapes. Pixels may be the basic building blocks of a display or digital image and with geometric coordinates.

When manufacturing the micro-LEDs, an etching process, such as a dry etching or a wet etching process, is frequently used to electrically isolate individual micro-LEDs. In order to yield a plurality of fully isolated functional micro-LED mesas, the conventional process typically etches away the continuous functional epitaxy layer completely. However, when transferring, or after transferring, the conventional micro-LED mesas to a substrate, such as a driving circuit substrate, the fully isolated functional micro-LED mesas may easily peel off from the substrate because the adhesion of the micro-LED mesas is weak. The problem is even more significant when the micro-LED mesas become even smaller. Furthermore, during the convention etching process to isolate the micro-LED mesas, the sidewalls of the micro-LED mesas may be damaged and impact the optical and electrical properties of the LED structure.

Embodiments of the disclosure address the above problems by providing a LED structure with a plurality of LED units surrounded by an isolation layer and the method for manufacturing the same, and therefore the drawbacks of using etching process can be avoided.

SUMMARY

Embodiments of the LED structure and method for forming the LED structure are disclosed herein.

In one example, a LED structure is disclosed. The LED structure includes a substrate, a bonding layer, a first doping type semiconductor layer, a multiple quantum well (MQW) layer, a second doping type semiconductor layer, a passivation layer and an electrode layer. The bonding layer is formed on the substrate, and the first doping type semiconductor layer is formed on the bonding layer. The MQW layer is formed on the first doping type semiconductor layer, and the second doping type semiconductor layer is formed on the MQW layer. The second doping type semiconductor layer includes an isolation material made through implantation, and the passivation layer is formed on the second doping type semiconductor layer. The electrode layer is formed on the passivation layer in contact with a portion of the second doping type semiconductor layer through a first opening on the passivation layer.

In another example, a LED structure is disclosed. The LED structure includes a substrate and a plurality of LED units formed on the substrate. Each LED unit includes a bonding layer formed on the substrate, a first doping type semiconductor layer formed on the bonding layer, a multiple quantum well (MQW) layer formed on the first doping type semiconductor layer, and a second doping type semiconductor layer formed on the MQW layer. The plurality of LED units includes a first LED unit and a second LED unit adjacent to the first LED unit. The second doping type semiconductor layer of the first LED unit is electrically isolated with the second doping type semiconductor layer of the second LED unit by an ion-implanted material.

In a further example, a method for manufacturing a LED structure is disclosed. A semiconductor layer is formed on a first substrate. The semiconductor layer includes a first doping type semiconductor layer, a MQW layer on the first doping type semiconductor layer, and a second doping type semiconductor layer on the MQW layer. An implantation operation is performed to form an ion-implanted material in the second doping type semiconductor layer. A first etching operation is performed to remove at least a portion of the ion-implanted material, a portion of the MQW, a portion of the first doping type semiconductor layer and a portion of the bonding layer to expose a contact of a driving circuit formed in the first substrate. A passivation layer is formed on the second doping type semiconductor layer. A first opening is formed on the passivation layer exposing a portion of the second doping type semiconductor layer and a second opening is formed on the passivation layer exposing the contact on the first substrate. An electrode layer is formed on the passivation layer covering the first opening and the second opening.

BRIEF DESCRIPTION OF THE DRAWINGS

The accompanying drawings, which are incorporated herein and form a part of the specification, illustrate implementations of the present disclosure and, together with the description, further serve to explain the present disclosure and to enable a person skilled in the pertinent art to make and use the present disclosure.

FIGS. 6A-6H illustrate cross sections of an exemplary LED structure at different stages of a manufacturing process, according to some implementations of the present disclosure.

FIG. 8 is a flowchart of an exemplary method for manufacturing a LED structure, according to some implementations of the present disclosure.

Figure 1:
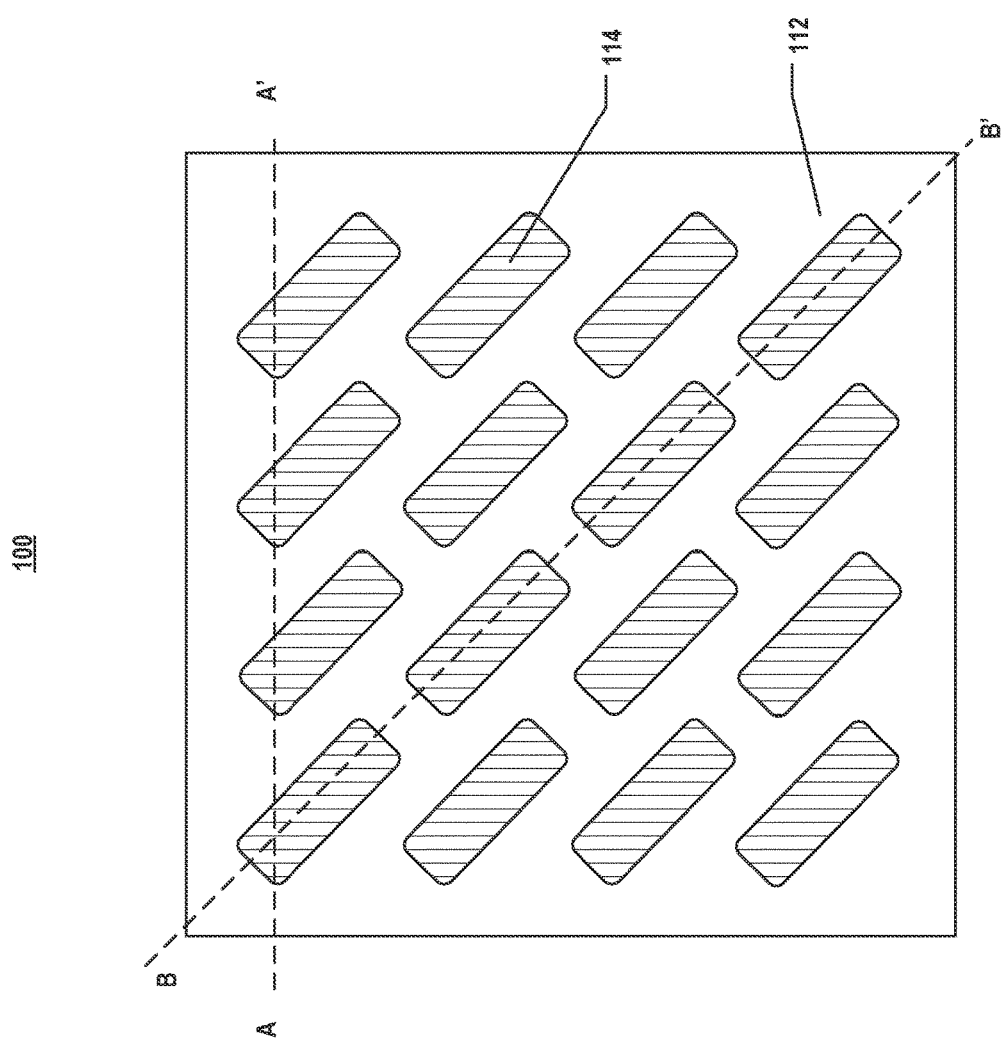
FIG. 1 illustrates a top view of an exemplary LED structure, according to some implementations of the present disclosure.

Implementations of the present disclosure will be described with reference to the accompanying drawings.

DETAILED DESCRIPTION

Although specific configurations and arrangements are discussed, it should be understood that this is done for illustrative purposes only. As such, other configurations and arrangements can be used without departing from the scope of the present disclosure. Also, the present disclosure can also be employed in a variety of other applications. Functional and structural features as described in the present disclosures can be combined, adjusted, and modified with one another and in ways not specifically depicted in the drawings, such that these combinations, adjustments, and modifications are within the scope of the present discloses.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "layer" refers to a material portion including a region with a thickness. A layer can extend over the entirety of an underlying or overlying structure or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layers thereupon, thereabove, and/or therebelow. A layer can include multiple layers. For example, a semiconductor layer can include one or more doped or undoped semiconductor layers and may have the same or different materials.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, silicon carbide, gallium nitride, germanium, gallium arsenide, indium phosphide, etc. Alternatively, the substrate can be made from an electrically non-conductive material, such as a glass, a plastic, or a sapphire wafer. Further alternatively, the substrate can have semiconductor devices or circuits formed therein.

As used herein, the term "micro" LED, "micro" p-n diode or "micro" device refers to the descriptive size of certain devices or structures according to implementations of the invention. As used herein, the terms "micro" devices or structures are meant to refer to the scale of 0.1 to 100 μm. However, it is to be appreciated that implementations of the present invention are not necessarily so limited, and that certain aspects of the implementations may be applicable to larger, and possibly smaller size scales.

Implementations of the present invention describe a LED structure or a micro-LED structure and a method for manufacturing the structure. For manufacturing a micro-LED display, an epitaxy layer is bonded to a receiving substrate. The receiving substrate, for example, may be, but is not limited to, a display substrate including a CMOS backplane or TFT glass substrate. Then the epitaxy layer is formed with an array of micro-LEDs on the receiving substrate. When forming the micro-LEDs on the receiving substrate, because the adhesion of the small functional mesas on the receiving substrate is weak and it is proportional to the mesa size, the plurality of small functional mesas may peel off from the receiving substrate and cause failure of a display (dead pixel) during the manufacturing process. To address the aforementioned issues, the present disclosure introduces a solution in which the functional LED mesas are isolated by an isolation material without performing etching process on the epitaxy layer, and therefore the adhesion area between the functional LEDs and the receiving substrate could be enlarged to avoid potential peeling off. In addition, the manufacturing method described in the present disclosure can further reduce physical damage of sidewalls of functional LED mesas, reduce damage of quantum well structure which is the light emitting region of the LET), and improve the optical and electrical properties of functional mesas.

Figure 2:
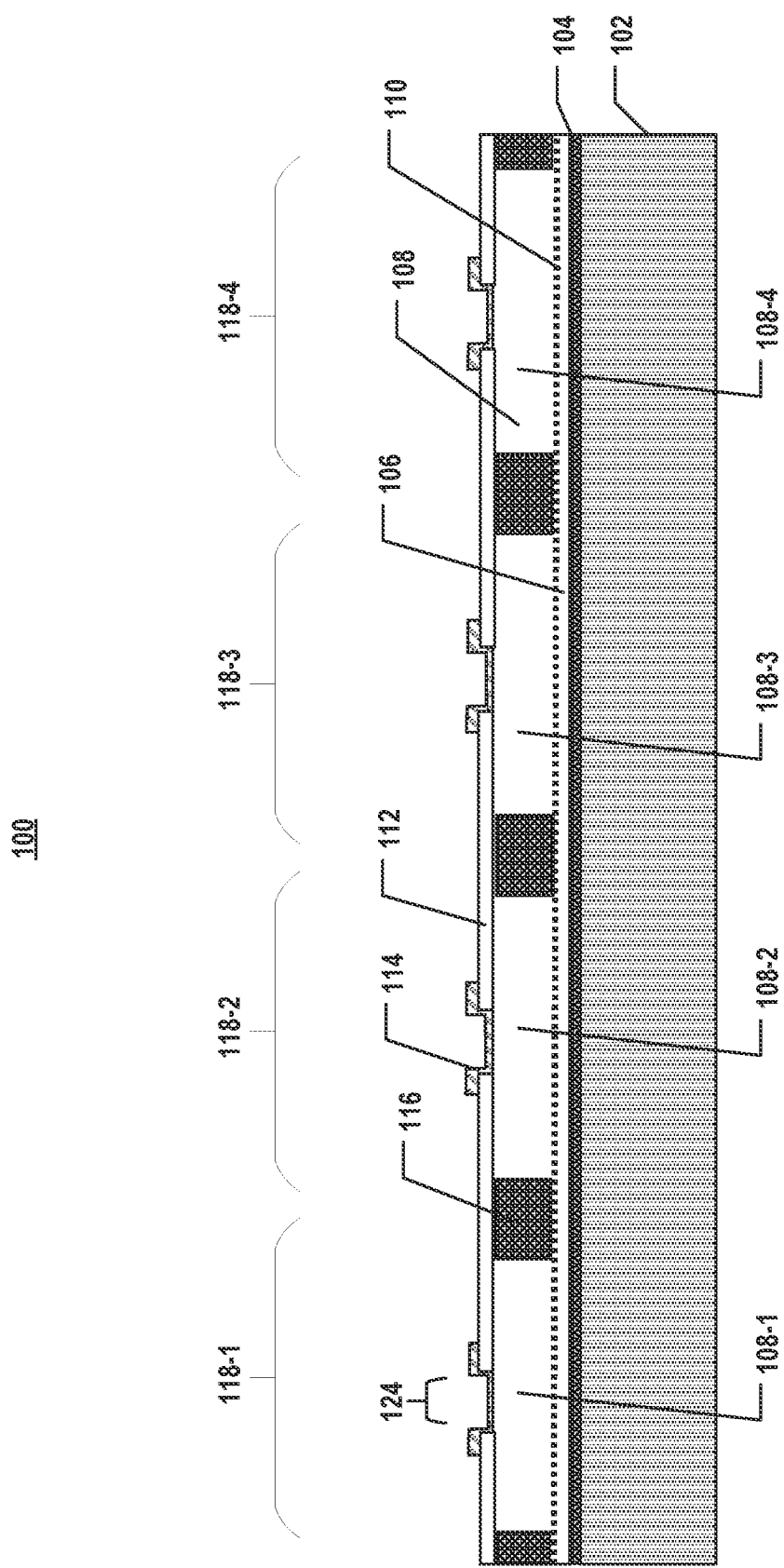
FIG. 2 illustrates a cross-section view of an exemplary LED structure, according to some implementations of the present disclosure.

FIG. 1 illustrates a top view of an exemplary LED structure 100, according to some implementations of the present disclosure, and FIG. 2 illustrates a cross-section view of an exemplary LED structure 100 along line A-A', according to some implementations of the present disclosure. For the purpose of better explaining the present disclosure, the top view of LED structure 100 in FIG. 1 and the cross-section view of LED structure 100 in FIG. 2 will be described together. LED structure 100 includes a first substrate 102 and a plurality of LED units 118 (e.g., LED units 118-1, 118-2, 118-3, and 118-4 as shown in FIG. 2). LED units 118 are bonded on first substrate 102 through a bonding layer 104. In some implementations, first substrate 102 may include a semiconductor material, such as silicon, silicon carbide, gallium nitride, germanium, gallium arsenide, indium phosphide. In some implementations, first substrate 102 may be made from an electrically non-conductive material, such as a glass, a plastic or a sapphire wafer. In some implementations, first substrate 102 may have driving circuits formed therein, and first substrate 102 may be CMOS backplane or TFT glass substrate. The driving circuit provides the electronic signals to LED units 118 to control the luminance. In some implementations, the driving circuit may include an active matrix driving circuit, in which each individual LED unit 118 corresponds to an independent driver. In some implementations, the driving circuit may include a passive matrix driving circuit, in which the plurality of LED units 118 are aligned in an array and are connected to the data lines and the scan lines driven by the driving circuit.

Bonding layer 104 is a layer of an adhesive material formed on first substrate 102 to bond first substrate 102 and LED units 118. In some implementations, bonding layer 104 may include a conductive material, such as metal or metal alloy. In some implementations, bonding layer 104 may include Au, Sn In Cu or Ti. In some implementations, bonding layer 104 may include a non-conductive material, such as polyimide (PI), polydimethylsiloxane (PDMS). In some implementations, bonding layer 104 may include a photoresist, such as SU-8 photoresist. In some implementations, bonding layer 104 may be hydrogen silsesquioxane (HSQ) or divinylsiloxane-bis-benzocyclobutene (DVS-BCB). It is understood that the descriptions of the material of bonding layer 104 are merely illustrative and are not limiting, and those skilled in the art can change according to requirements, all of which are within the scope of the present application.

Referring to FIG. 2, each LED unit 118 includes its portion of bonding layer 104, a first doping type semiconductor layer 106, a second doping type semiconductor layer 108, and a multiple quantum well (MQW) layer 110 formed between first doping type semiconductor layer 106 and second doping type semiconductor layer 108. First doping type semiconductor layer 106 is formed on bonding layer 104. In some implementations, first doping type semiconductor layer 106 and second doping type semiconductor layer 108 may include one or more layers formed with II-VI materials, such as ZnSe or ZnO, or Ill-V nitride materials, such as GaN, AlN, InN, InGaN, GaP, AlInGaP, AlGaAs, and their alloys.

In some implementations, first doping type semiconductor layer 106 may be a p-type semiconductor layer that extends across multiple LED units 118 (e.g., four LED units 118 as illustrated in FIG. 2) and forms a common anode of these LED units 118. For example, first doping type semiconductor layer 106 of LED unit 118-2 extends to its adjacent LED units 118-1 and 118-3, and similarly, first doping type semiconductor layer 106 of LED unit 118-3 extends to its adjacent LED units 118-2 and 118-4. In some implementations, first doping type semiconductor layer 106 that extends across the LED units may be relatively thin. By having a thin layer of continuous first doping type semiconductor across the individual LED units, the bonding area between substrate 102 and the plurality of LED units 118 is not limited in the area beneath second doping type semiconductor layer 108 but also extends to the areas between the individual LED units. In other words, by having a thin layer of continuous first doping type semiconductor layer 106, the area of bonding layer 104 is increased, Hence, the bonding strength between substrate 102 and the plurality of LED units 118 is increased and the risk of peeling-off of LED structure 100 can be reduced.

In some implementations, first doping type semiconductor layer 106 may include p-type GaN. In some implementations, first doping type semiconductor layer 106 may be formed by doping magnesium (Mg) in GaN. In some implementations, first doping type semiconductor layer 106 may include p-type InGaN. In some implementations, first doping type semiconductor layer 106 may include p-type AlInGaP. Each of LED units 118 has an anode and a cathode connected to the driving circuit, e.g., one that is formed in substrate 102 (driving circuit not explicitly shown). For example, each LED unit 118 has the anode connected to a constant voltage source and has the cathode connected to a source/drain electrode of the driving circuit. In other words, by forming the continuous first doping type semiconductor layer 106 across the individual LED units 118, the plurality of LED units 118 have a common anode formed by first doping type semiconductor layer 106 and bonding layer 104.

In some implementations, second doping type semiconductor layer 108 may be a n-type semiconductor layer and form a cathode of each LED unit 118. In some implementations, second doping type semiconductor layer 108 may include n-type GaN. In some implementations, second doping type semiconductor layer 108 may include n-type InGaN. In some implementations, second doping type semiconductor layer 108 may include n-type AlInGaP. Second doping type semiconductor layers 108 of different LED units 118 are electrically isolated, thus each LED unit 118 having a cathode that can have a voltage level different from the other units. As a result of the disclosed implementations, a plurality of individually functionable LED units 118 are formed with their first doping type semiconductor layers 106 horizontally extended across the adjacent LED units, and their second doping type semiconductor layers 108 electrically isolated between the adjacent LED units. Each LED unit 118 further includes a multiple quantum well (MQW) layer 110 formed between first doping type semiconductor layer 106 and second doping type semiconductor layer 108. MQW layer 110 is the active region of LED unit 118.

In some implementations, second doping type semiconductor layers 108 is divided by an isolation material 116. For example, as shown in FIG. 2, second doping type semiconductor layers 108 is divided into a plurality of LED mesas 108-1, 108-2, 108-3 and 108-4 by isolation material 116. In other words, LED mesas 108-1, 108-2, 108-3 and 108-4 are electrically isolated by isolation material 116 formed inbetween. For example, LED mesa 108-2 of LED unit 118-2 is electrically isolated with LED mesa 108-1 of LED unit 118-1 and LED mesa 108-3 of LED unit 118-3 by isolation material 116.

In some implementations, isolation material 116 may be an ion-implanted material. In some implementations, isolation material 116 may be formed by implanting ion materials in second doping type semiconductor layers 108. In some implementations, isolation material 116 may be formed by implanting $H^+$, $He^+$, $N^+$, $O^+$, $F^+$, $Mg^+$, $Si^+$ or $Ar^+$ ions in second doping type semiconductor layers 108. In some implementations, second doping type semiconductor layers 108 may be implanted with one or more ion materials to form isolation material 116. Isolation material 116 has the physical properties of electrical insulation. By implanting ion material in a defined area of second doping type semiconductor layers 108, the material of second doping type semiconductor layers 108 in the defined area may be transformed to isolation material 116, which electrically isolates LED mesas 108-1, 108-2, 108-3 and 108-4 from each other.

In some implementations, as shown in FIG. 2, isolation material 116 may be formed in second doping type semiconductor layers 108 for a depth not sufficient to penetrate MQW layer 110. MQW layer 110, first doping type semiconductor layer 106 and bonding layer 104 beneath each LED mesa may horizontally extend to MQW layer 110, first doping type semiconductor layer 106 and bonding layer 104 beneath adjacent LED mesas. For example, MQW layer 110, first doping type semiconductor layer 106 and bonding layer 104 beneath LED mesa 108-2 may horizontally extend to MQW layer 110, first doping type semiconductor layer 106 and bonding layer 104 beneath LED mesas 108-1 and 108-3.

In some implementations, the implantation depth of isolation material 116 may be controlled above MQW layer 110, as shown in FIG. 2. In some implementations, the implantation depth of isolation material 116 may be controlled to not penetrate MQW layer 110 and isolation material 116 stops short to contact first doping type semiconductor layer 106. It is understood that the location, shape, and depth of isolation material 116 shown in FIG. 2 are merely illustrative and are not limiting, and those skilled in the art can change according to requirements, all of which are within the scope of the present application.

As shown in FIG. 2, a passivation layer 112 is formed on second doping type semiconductor layer 108, including LED mesas 108-1, 108-2, 108-3 and 108-4 and isolation material 116. Passivation layer 112 may be used for protecting and isolating LED units 118. In some implementations, passivation layer 112 may include SiO$_2$, Al$_2$O$_3$, SiN or other suitable materials. In some implementations, passivation layer 112 may include polyimide, SU-8 photoresist, or other photo-patternable polymer. An electrode layer 114 is formed on a portion of passivation layer 112, and electrode layer 114 electrically connects second doping type semiconductor layer 108 through an opening 124 on passivation layer 112. In some implementations, electrode layer 114 may be conductive materials, such as indium tin oxide (ITO), Cr, Ti, Pt, Au, Al, Cu, Ge or Ni.

Figure 3:
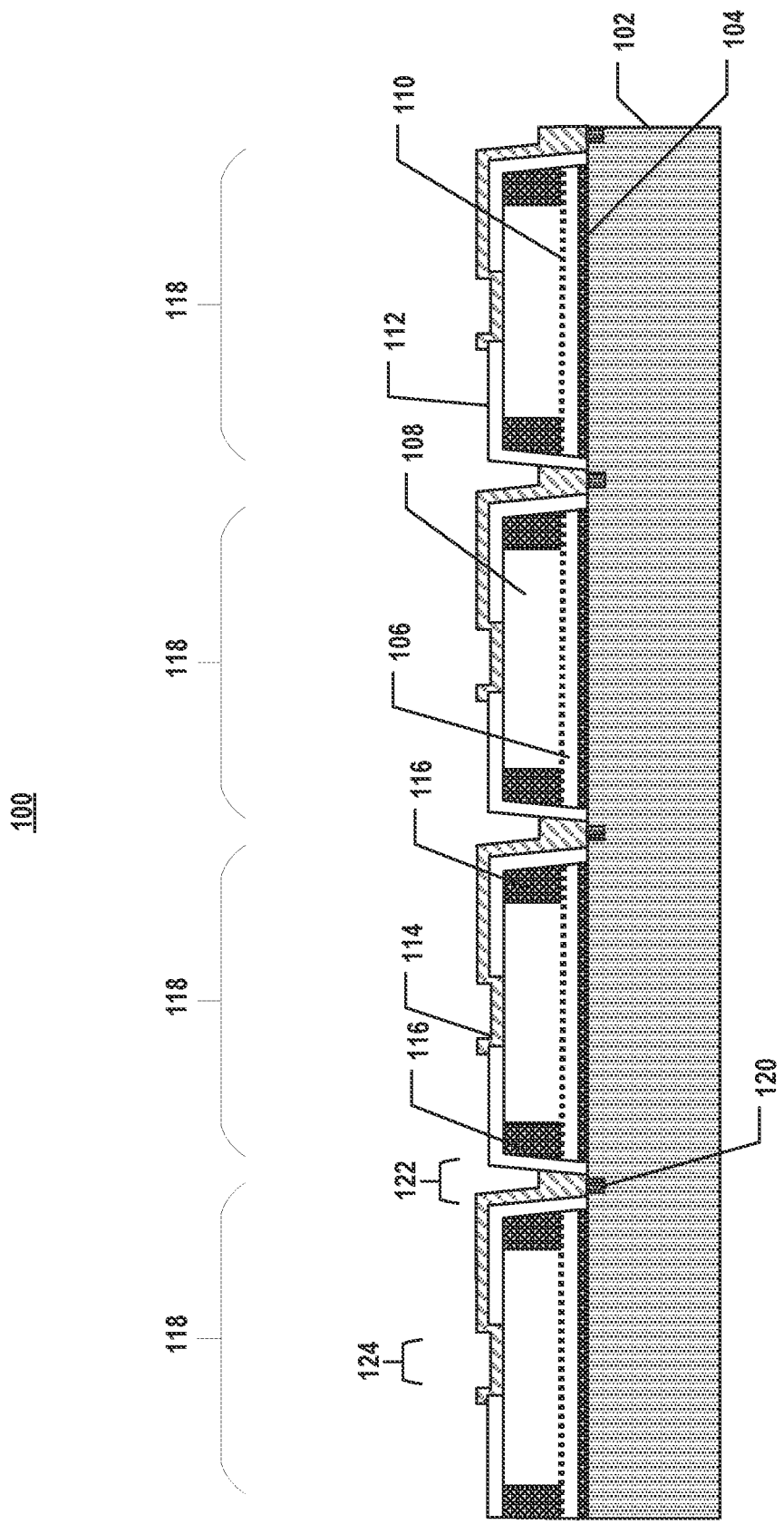
FIG. 3 illustrates another cross-section view of an exemplary LED structure, according to some implementations of the present disclosure.

FIG. 3 illustrates another cross-section view of the exemplary LED structure 100 along line B-B', according to some implementations of the present disclosure. First substrate 102 has driving circuits formed therein for driving LED units 118. A contact 120 of the driving circuit is exposed in an opening 122 between two LED units 118, and contact 120 is electrically connected with second doping type semiconductor layer 108 through electrode layer 114. In other words, the electrical connection of second doping type semiconductor layer 108 and contact 120 of the driving circuit is accomplished by electrode layer 114. As described above, second doping type semiconductor layer 108 forms the cathode of each LED unit 118, hence contact 120 provides a driving voltage of the cathode of each LED unit 118 from the driving circuit to second doping type semiconductor layer 108 through electrode layer 114.

Figure 4:
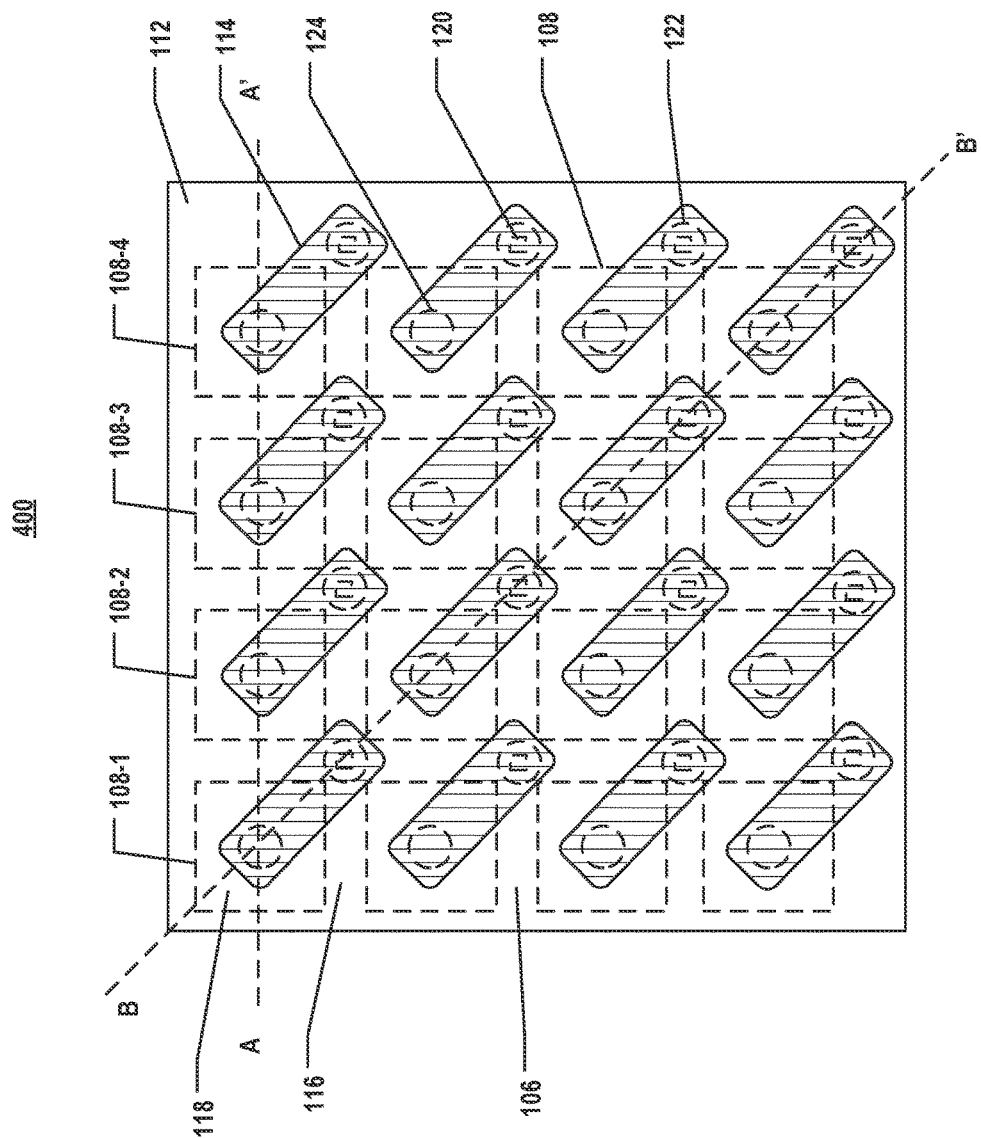
FIG. 4 illustrates another top view of an exemplary LED structure, according to some implementations of the present disclosure.

FIG. 4 illustrates another top view of LED structure 100, according to some implementations of the present disclosure. In FIG. 4, the layers beneath electrode layer 114 and passivation layer 112 are illustrated with dash lines for the purpose of explanation. In FIG. 4, LED structure 100 includes 16 LED units 118. Each LED unit 118 includes a p-n diode layer formed by first doping type semiconductor layer 106 and second doping type semiconductor layer 108 and multiple quantum well layer 110. Passivation layer 112 is formed on the p-n diode layer, and electrode layer 114 is formed on passivation layer 112.

Opening 124 is formed on passivation layer 112 exposing second doping type semiconductor layer 108, and opening 122 is formed on passivation layer 112 exposing contact 120. Electrode layer 114 is formed on a portion of passivation layer 112 covering opening 124 and opening 122, and therefore electrode layer 114 electrically connects with second doping type semiconductor layer 108 and contact 120. In the examples shown in FIG. 4, opening 124 is located at the center of each LED unit 118 and opening 122 is located at the interspace of adjacent LED units 118. It is understood that the locations and designs (such as shapes and sizes) of opening 124, opening 122 and electrode layer 114 may deviate from the examples shown in FIG. 4 based on the specific implementations and are not limited here.

In FIG. 4, LED structure 100 includes 16 LED units 118, and each LED unit 118 is individually functionable. Second doping type semiconductor layer 108 of each LED unit 118 is electrically isolated by isolation material 116. First doping type semiconductor layer 106 locates under second doping type semiconductor layer 108 and passivation layer 112, and first doping type semiconductor layer 106 is the common anode of these 16 LED units 118. Consistent with the present disclosure, a plurality of LED units are referred to as "individually functionable" when first doping type semiconductor layer 106 of these LED units (e.g., the 16 LED units 118) is electrically connected not only during the manufacturing process of forming LED structure 100 but also after the manufacturing process and each LED unit 118 can be individually driven by a different driving circuit.

Figure 5:
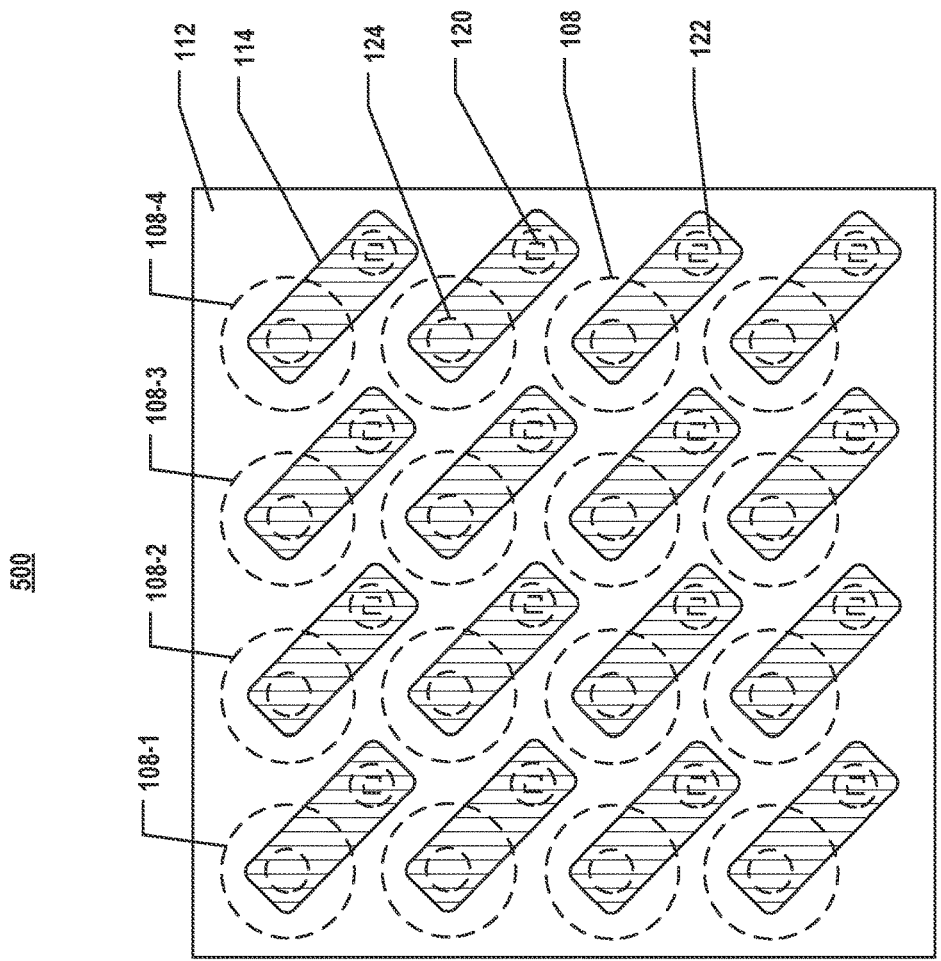
FIG. 5 illustrates a top view of another exemplary LED structure, according to some implementations of the present disclosure.

FIG. 5 illustrates a top view of another LED structure 500, according to some implementations of the present disclosure. The shape of LED mesa 108-1 in the top view in FIG. 5 is circular, which is different from the shape of LED mesa 108-1 in the top view of LED structure 100 shown in FIG. 4. By implanting ion material in a different defined area of second doping type semiconductor layers 108, the shape of LED mesa 108-1 may be formed differently. It is understood that, in some implementations, the position and shape of LED mesas in the top view may be changed according to various designs or applications, and the shape of LED mesas or LED unit 118 in the top view is not limited here. In some implementations, the position and shape of opening 124, opening 122, electrode layer 114 or contact 120 in the top view may be changed according to various designs and applications as well, and is not limited here.

FIGS. 6A-6H illustrate cross sections of the exemplary LED structure 100 during a manufacturing process, according to some implementations of the present disclosure, FIGS. 7A-7D illustrate top views of LED structure 100 at different stages of a manufacturing process, according to some implementations of the present disclosure, and FIG. 8 is a flowchart of an exemplary method 800 for manufacturing LED structure 100, according to some implementations of the present disclosure. For the purpose of better explaining the present disclosure, FIGS. 6A-6I, FIGS. 7A-7D and FIG. 8 will be described together.

Figure 6A:
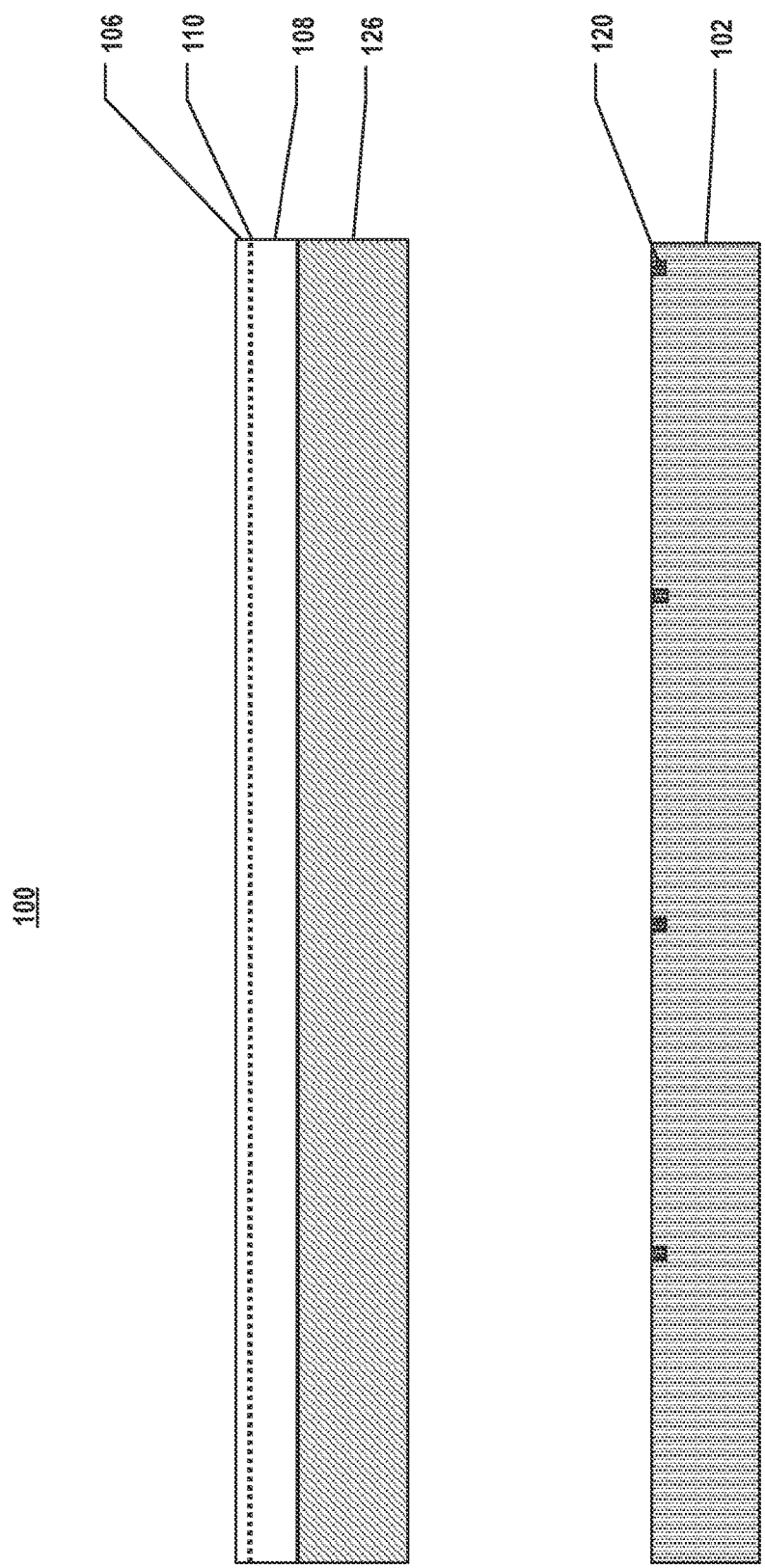

In FIG. 6A, a driving circuit is formed in first substrate 102 and the driving circuit includes contact 120. For example, the driving circuit may include CMOS devices manufactured on a silicon wafer and some wafer-level packaging layers or fan-out structures are stacked on the CMOS devices to form contact 120. For another example, the driving circuit may include TFTs manufactured on a glass substrate and some wafer-level packaging layers or fan-out structures are stacked on the TFTs to form contact 120. A semiconductor layer is formed on a second substrate 126, and the semiconductor layer includes first doping type semiconductor layer 106, second doping type semiconductor layer 108 and MQW layer 110.

In some implementations, first substrate 102 or second substrate 126 may include a semiconductor material, such as silicon, silicon carbide, gallium nitride, germanium, gallium arsenide, indium phosphide. In some implementations, first substrate 102 or second substrate 126 may be made from an electrically non-conductive material, such as a glass, a plastic or a sapphire wafer. In some implementations, first substrate 102 may have driving circuits formed therein, and first substrate 102 may include a CMOS backplane or TFT glass substrate. In some implementations, first doping type semiconductor layer 106 and second doping type semiconductor layer 108 may include one or more layers based on II-VI materials, such as ZnSe or ZnO, or III-V nitride materials, such as GaN, AlN, InN, InGaN, GaP, AlInGaP, AlGaAs, and their alloys. In some implementations, first doping type semiconductor layer 106 may include a p-type semiconductor layer, and second doping type semiconductor layer 108 may include a n-type semiconductor layer.

Figure 6B:
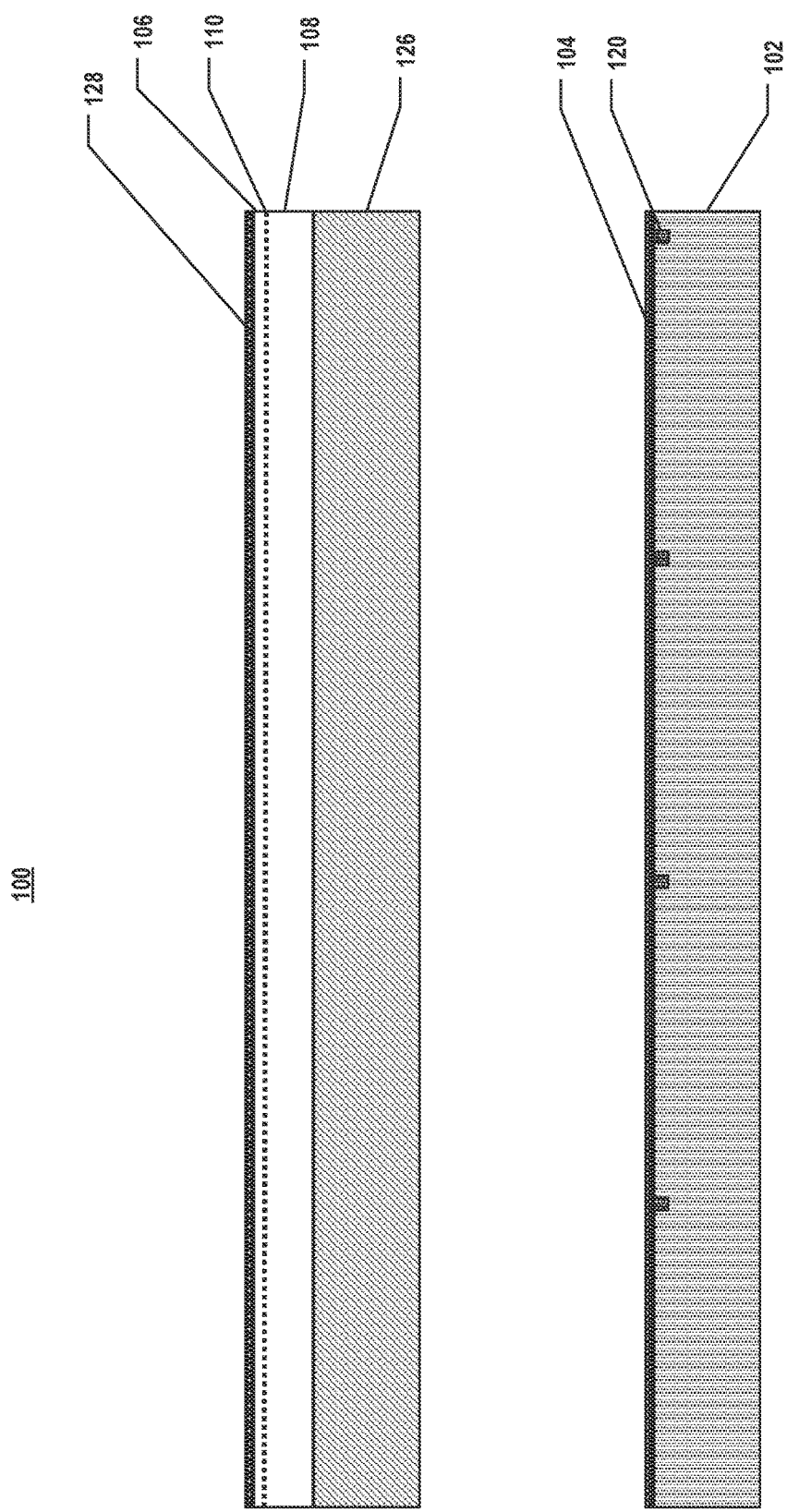

In FIG. 6B, bonding layer 104 is formed on first substrate 102. In some implementations, bonding layer 104 may include a conductive material, such as metal or metal alloy. In some implementations, bonding layer 104 may include Au, Sn In Cu or Ti. In some implementations, bonding layer 104 may include a non-conductive material, such as polyimide (PI), or polydimethylsiloxane (PDMS). In some implementations, bonding layer 104 may include a photoresist, such as SU-8 photoresist. In some implementations, bonding layer 104 may include hydrogen silsesquioxane (HSQ) or divinylsiloxane-bis-benzocyclobutene (DVS-BCB). In some implementations, a conductive layer 128 may be formed on first doping type semiconductor layer 106. In some implementations, conductive layer 128 may form a common electrode covering the entire first doping type semiconductor layer 106. In some implementations, conductive layer 128 may form an ohmic contact on first doping type semiconductor layer 106. In some implementations, conductive layer 128 and bonding layer 104 may be collectively referred to as one layer in later operations.

Figure 6C:
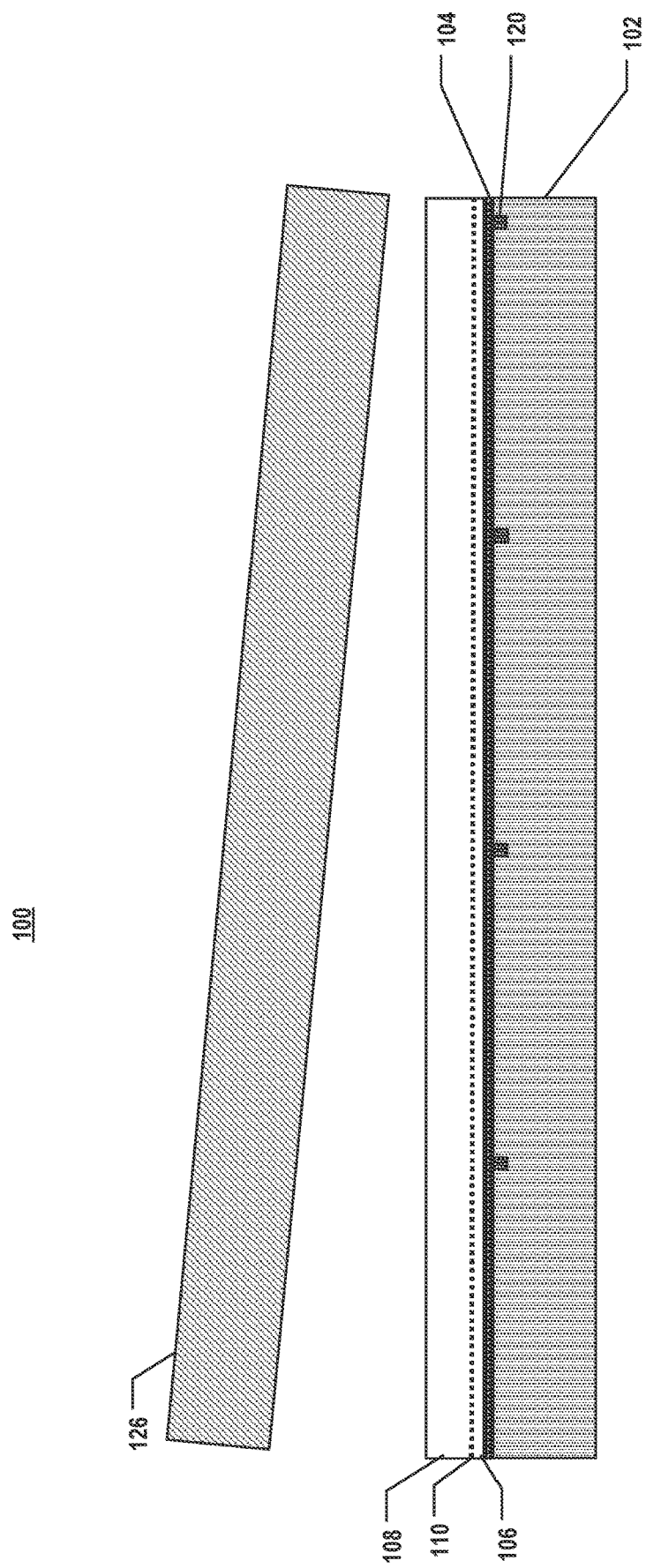

Referring to FIG. 6C and operation 802 of FIG. 8, second substrate 126 and the semiconductor layer, including first doping type semiconductor layer 106, second doping type semiconductor layer 108 and MQW layer 110, are flipped over and bonded to first substrate 102 through bonding layer 104 and conductive layer 128. Then, second substrate 126 may be removed from the semiconductor layer. FIG. 6C shows bonding layer 104 between first substrate 102 and first doping type semiconductor layer 106. However, in some implementations, bonding layer 104 may include one or multiple layers to bond first substrate 102 and first doping type semiconductor layer 106. For example, bonding layer 104 may include a single conductive or non-conductive layer. For another example, bonding layer 104 may include an adhesive layer and a conductive or non-conductive layer. In some implementations, bonding layer 104 and conductive layer 128 may be collectively referred to as one layer after operation 802. It is understood that the descriptions of the material of bonding layer 104 are merely illustrative and are not limiting, and those skilled in the art can change accordingly to requirements, all of which are within the scope of the present application.

Figure 7A:
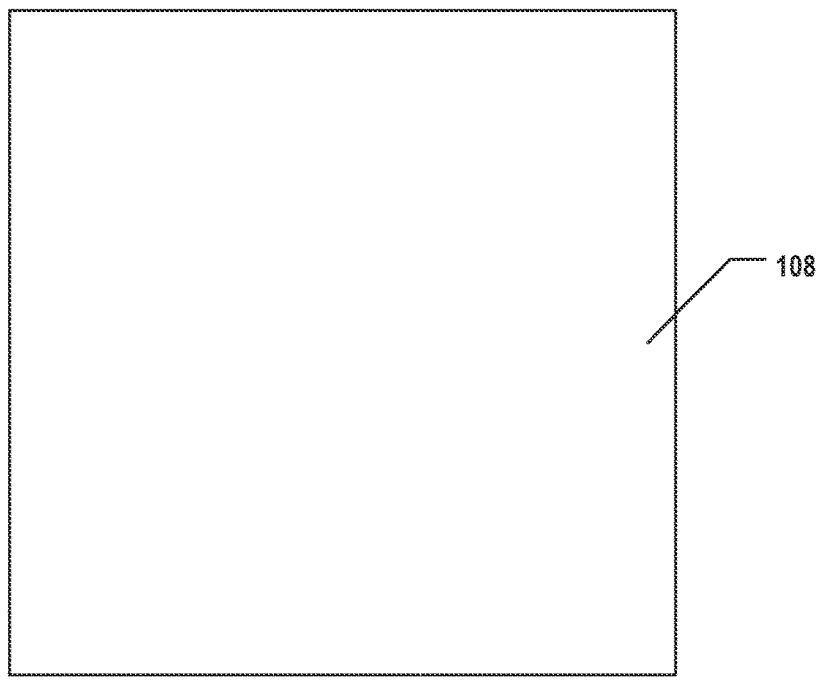
FIGS. 7A-7D illustrate top views of an exemplary LED structure at different stages of a manufacturing process, according to some implementations of the present disclosure.

In FIG. 6D, a thinning operation may be performed on second doping type semiconductor layer 108 to remove a portion of second doping type semiconductor layer 108. FIG. 7A shows a top view of second doping type semiconductor layer 108 after the thinning operation. In some implementations, the thinning operation may include a etching or a wet etching operation. In some implementations, the thinning operation may include a chemical-mechanical polishing (CMP) operation. In some implementations, the thickness including first doping type semiconductor layer 106, MQW layer 110 and second doping type semiconductor layer 108 may be between about 0.3 μm and about 5 μm. In some other implementations, the thickness including first doping type semiconductor layer 106, MQW layer 110 and second doping type semiconductor layer 108 may be between about 0.4 μm and about 4 μm. In some alternative implementations, the thickness including first doping type semiconductor layer 106, MQW layer 110 and second doping type semiconductor layer 108 may be between about 0.5 μm and about 3 μm.

Figure 7B:
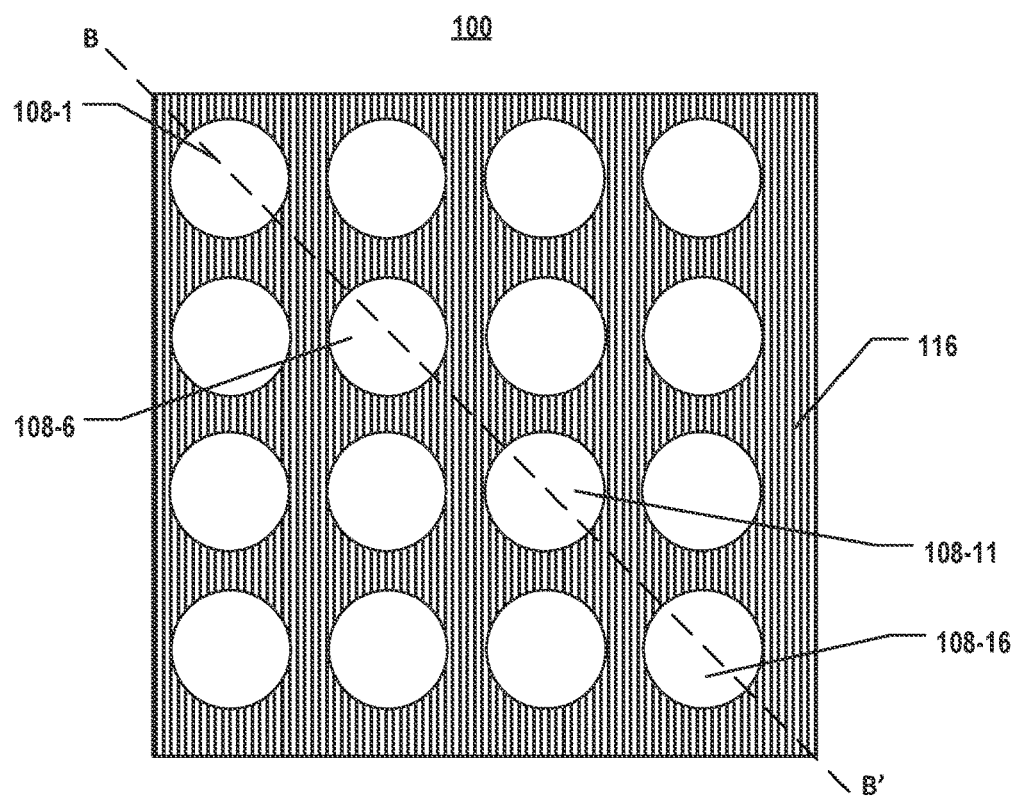

Referring to FIG. 6E and operation 804 of FIG. 8, an implantation operation is performed to form an isolation material 116 in second doping type semiconductor layer 108, and as a result of the implantation, second doping type semiconductor layer 108 is divided into a plurality of LED mesas 108-1, 108-6, 108-11 and 108-16 by isolation material 116. The plurality of LED mesas 108-1, 108-6, 108-11 and 108-16 are electrically isolated from each other by isolation material 116. FIG. 7B shows a top view of LED structure 100 after the implantation operation, and FIG. 6E shows the cross section along line BB' in FIG. 7B. In FIG. 7B, second doping type semiconductor layer 108 is divided into a plurality of LED mesas 108-1, 108-6, 108-11 and 108-16 by isolation material 116.

In some implementations, isolation material 116 may be formed by implanting ion materials to a defined region in second doping type semiconductor layers 108. In some implementations, isolation material 116 may be formed by implanting $H^+$, $He^+$, $N^+$, $O^+$, $F^+$, $Mg^+$, $Si^+$ or $Ar^+$ ions in second doping type semiconductor layers 108. In some implementations, second doping type semiconductor layers 108 may be implanted with one or more ion materials to form isolation material 116. Isolation material 116 has the physical properties of electrical insulation. By implanting ion material in a defined area of second doping type semiconductor layers 108, the material of second doping type semiconductor layers 108 in the defined area may be transformed to isolation material 116 and electrically isolate LED mesas 108-1, 108-6, 108-11 and 108-16. In some implementations, the implantation operation may be performed with an implantation power between about 10 keV and about 300 keV. In some implementations, the implantation operation may be performed with an implantation power between about 15 keV and about 250 keV. In some implementations, the implantation operation may be performed with an implantation power between about 20 keV and about 200 keV.

In some implementations, isolation material 116 may be formed in second doping type semiconductor layers 108 for a depth not sufficient to penetrate MQW layer 110, MQW layer 110, first doping type semiconductor layer 106 and bonding layer 104 beneath each LED mesa may horizontally extend to MQW layer 110, first doping type semiconductor layer 106 and bonding layer 104 beneath adjacent LED mesas. For example, MQW layer 110, first doping type semiconductor layer 106 and bonding layer 104 beneath LED mesa 108-6 may horizontally extend to MQW layer 110, first doping type semiconductor layer 106 and bonding layer 104 beneath LED mesas 108-1 and 108-11.

In some implementations, the implantation depth of isolation material 116 may be controlled so that isolation material 116 stops short to contact MQW layer 110, as shown in FIG. 6E. In some implementations, the implantation depth of isolation material 116 may be controlled to not penetrate MQW layer 110 and isolation material stops short to contact first doping type semiconductor layer 106. It is understood that the location, shape, and depth of isolation material 116 shown in FIG. 6E are merely illustrative and are not limiting, and those skilled in the art can change according to specific implementations, all of which are within the scope of the present application.

Figure 6F:
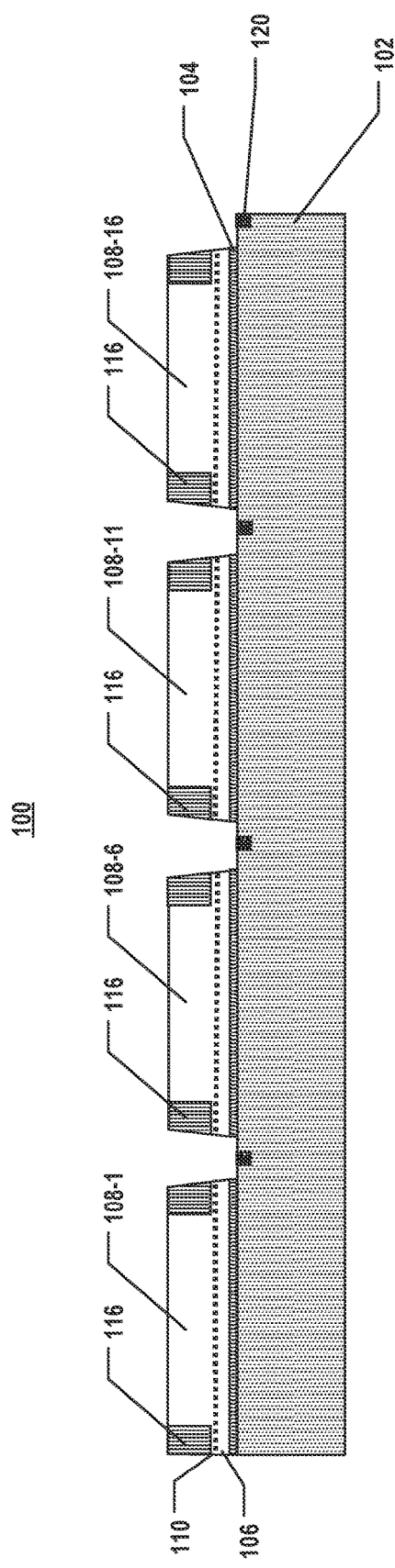
Figure 7C:
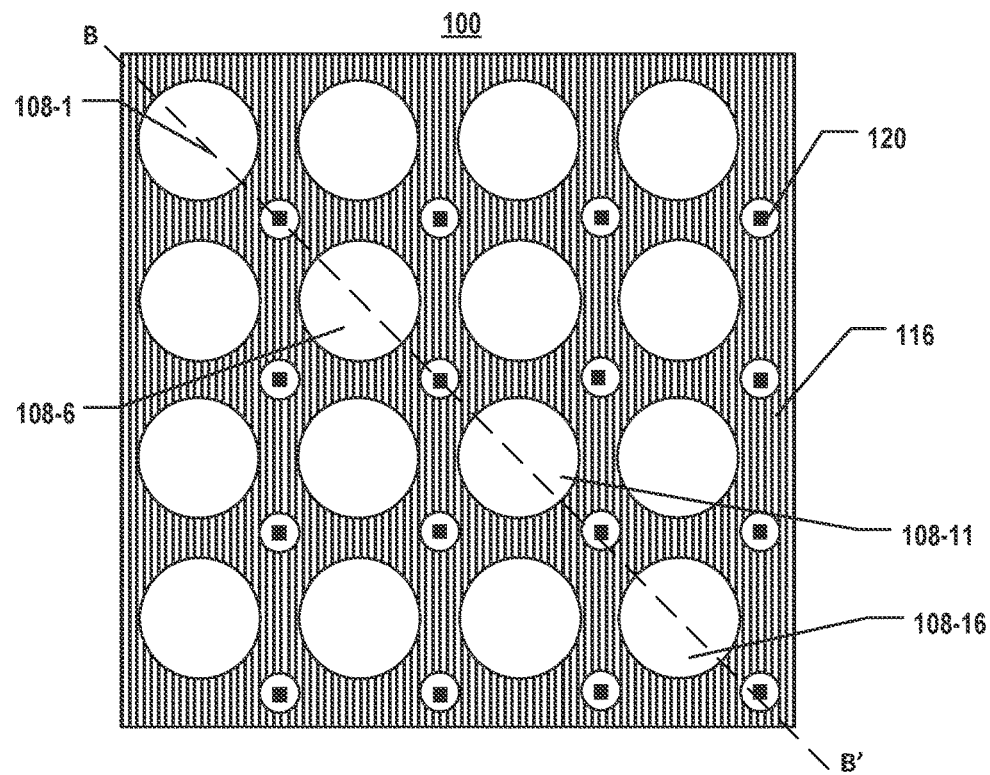

Referring to FIG. 6F and operation 806 of FIG. 8, a first etching operation is performed to remove a portion of isolation material 116, a portion of MQW layer 110, and a portion of first doping type semiconductor layer 106 to expose contact 120 of the driving circuit formed in first substrate 102. FIG. 7C shows a top view of LED structure 100 after the first etching operation. The first etching operation may be a dry etching or a wet etching operation. In a dry etching operation or a wet etching operation, a hard mask (e.g., a photoresist) may be formed on second doping type semiconductor layer 108 by photolithography process. Then, the uncovered portion of second doping type semiconductor layer 108 is removed by dry etching plasma or wet etching solution to expose contact 120. During the first etching operation, LED mesas are protected by isolation material 116, and the physical damage of sidewalls of LED mesas can be therefore prevented.

Figure 6G:
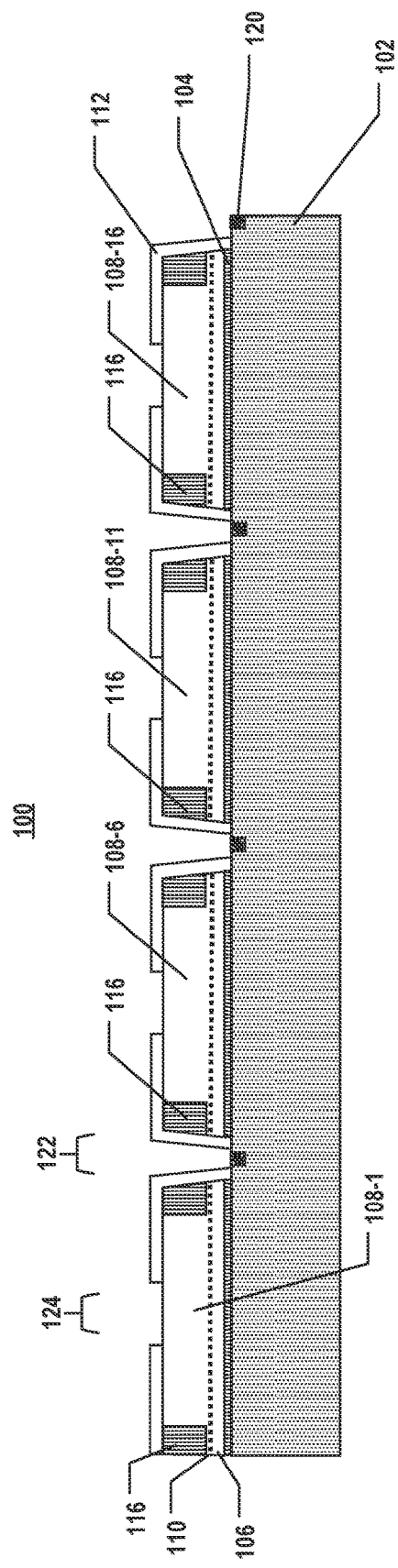
Figure 7D:
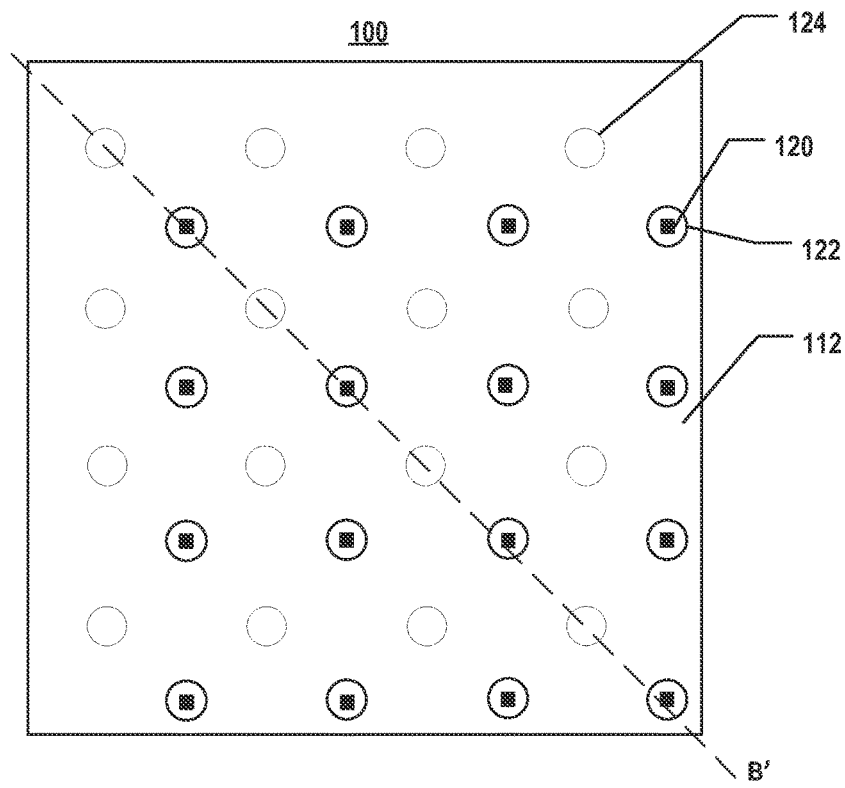

Referring to FIG. 6G and operations 808 and 810 of FIG. 8, passivation layer 112 is formed on second doping type semiconductor layer 108, and first opening 124 is formed on passivation layer 112 exposing a portion of second doping type semiconductor layer 108 and second opening 122 is formed on passivation layer 112 exposing contact 120. FIG. 7D shows a top view of LED structure 100 after forming openings 122 and 124. The LED structure 100 is covered by passivation layer 112 and openings 122 and 124 expose second doping type semiconductor layer 108 and contacts 120.

In some implementations, passivation layer 112 may include $SiO_2$, $Al_2O_3$, SiN or other suitable materials for isolation and protection. In some implementations, passivation layer 112 may include polyimide, SU-8 photoresist, or other photo-patternable polymer. In operation 810 of FIG. 8, opening 124 and opening 122 are formed to expose a portion of second doping type semiconductor layer 108 and expose contact 120. In some implementations, operation 810 may be performed by a second etching operation to remove a portion of passivation layer 112 and form opening 124 and opening 122. In some further implementations, provided passivation layer 112 is formed by a photo-sensitive material (e.g., polyimide, SU-8 photoresist, or other photo-patternable polymer), operation 810 may be performed by a photolithography operation to pattern passivation layer 112 and expose opening 124 and opening 122.

Figure 6H:
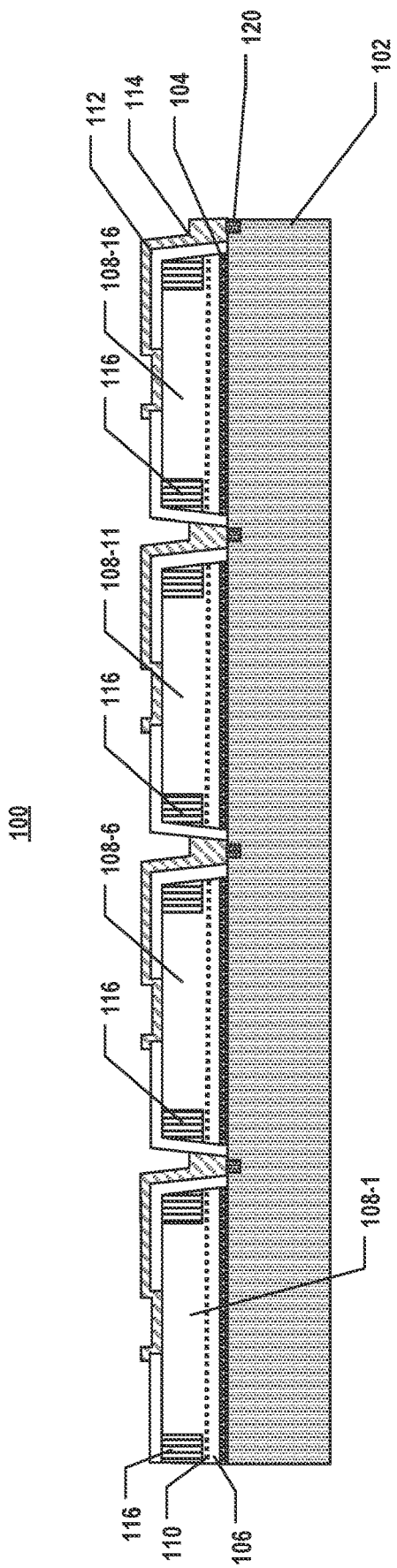

Referring to FIG. 6H and operation 812 of FIG. 8, electrode layer 114 is formed on passivation layer 112 covering opening 124 and opening 122. The top view of LED structure 100 after operation 812 is shown in FIG. 1. Electrode layer 114 electrically connects second doping type semiconductor layer 108 and contact 120 and forms an electrical path to connect the LED unit with the driving circuit in substrate 102. The driving circuit may control the voltage and current level of second doping type semiconductor layer 108 through contact 120 and electrode layer 114. In some implementations, electrode layer 114 may include conductive materials, such as indium tin oxide (ITO), Cr, Ti, Pt, Au, Al, Cu, Ge or Ni.

The present disclosure provides a LED structure and a method for manufacture the LED structure in which second doping type semiconductor layer 108 is divided by isolation material 116. The functional LED mesas are divided by isolation material 116 without performing etching process on the epitaxy layer, and therefore the adhesion area between the functional LEDs and the receiving substrate could be enlarged to avoid potential peeling off. Because ion-implanted semiconductor material may have a physical characteristic of high electrical resist, the current flow of LED units could be confined within a certain semiconductor layer, which define the light emitting areas. By using ion implantation to form the isolation material in the semiconductor functional epitaxy layer to form highly resistive region, the present disclosure may eliminate the use of wet etching or dry etching in the formation of LED mesas, avoid the physical damage of sidewall of LED mesas, and improve the optical and electrical properties of LED units. Furthermore, without using conventional isolation trenches between mesas, the space and density of micro-LED array limited by the physical trenches could be greatly improved.

According to one aspect of the present disclosure, a LED structure is disclosed. The LED structure includes a substrate, a bonding layer, a first doping type semiconductor layer, a multiple quantum well (MQW) layer, a second doping type semiconductor layer, a passivation layer and an electrode layer. The bonding layer is formed on the substrate, and the first doping type semiconductor layer is formed on the bonding layer. The MQW layer is formed on the first doping type semiconductor layer, and the second doping type semiconductor layer is formed on the MQW layer. The second doping type semiconductor layer includes an isolation material made through implantation, and the passivation layer is formed on the second doping type semiconductor layer. The electrode layer is formed on the passivation layer in contact with a portion of the second doping type semiconductor layer through a first opening on the passivation layer.

In some implementations, the isolation material divides the second doping type semiconductor layer into a plurality of LED mesas. In some implementations, the LED structure further includes a plurality of contacts of a driving circuit formed in the substrate, and each contact is located at an interspace of adjacent LED mesas. In some implementations, the electrode layer electrically connects the second doping type semiconductor layer and the contact through the first opening and a second opening on each contact.

In some implementations, the plurality of LED mesas include a first LED mesa and a second LED mesa adjacent to the first LED mesa, and the MQW layer, the first doping type semiconductor layer and the bonding layer beneath the first LED mesa horizontally extend to the MQW layer, the first doping type semiconductor layer and the bonding layer beneath the second LED mesa. In some implementations, the isolation material includes an ion-implanted material.

According to another aspect of the present disclosure, a LED structure is disclosed. The LED structure includes a substrate and a plurality of LED units formed on the substrate. Each LED unit includes a bonding layer formed on the substrate, a first doping type semiconductor layer formed on the bonding layer, a multiple quantum well (MQW) layer formed on the first doping type semiconductor layer, and a second doping type semiconductor layer formed on the MQW layer. The plurality of LED units includes a first LED unit and a second LED unit adjacent to the first LED unit. The second doping type semiconductor layer of the first LED unit is electrically isolated with the second doping type semiconductor layer of the second LED unit by an ion-implanted material.

In some implementations, the MQW layer, the first doping type semiconductor layer and the bonding layer of the first LED unit horizontally extend to the MQW layer, the first doping type semiconductor layer and the bonding layer of the second LED unit. In some implementations, the ion-implanted material is formed in the second doping type semiconductor layer and on the MQW layer.

In some implementations, the LED structure further includes a passivation layer formed on the second doping type semiconductor layer of the plurality of LED units isolated by the ion-implanted material, and an electrode layer formed on the passivation layer in contact with a portion of the second doping type semiconductor layer of each LED unit through a first opening on the passivation layer of each LED unit.

In some implementations, the LED structure further includes a plurality of contacts of a driving circuit formed in the substrate, and each contact is located at an interspace of adjacent LED units. In some implementations, the electrode layer electrically connects the second doping type semiconductor layer of each LED unit and each contact through the first opening of each LED unit and a second opening on each contact. In some implementations, the ion-implanted material includes hydrogen, helium, nitrogen, oxygen, fluorine, magnesium, silicon, or argon ion implanted material.

According to a further aspect of the present disclosure, a method for manufacturing a LED structure is disclosed. A semiconductor layer is formed on a first substrate. The semiconductor layer includes a first doping type semiconductor layer, a MQW layer on the first doping type semiconductor layer, and a second doping type semiconductor layer on the MQW layer. An implantation operation is performed to form an ion-implanted material in the second doping type semiconductor layer. A first etching operation is performed to remove at least a portion of the ion-implanted material, a portion of the MQW, a portion of the first doping type semiconductor layer and a portion of the bonding layer to expose a contact of a driving circuit formed in the first substrate. A passivation layer is formed on the second doping type semiconductor layer. A first opening is formed on the passivation layer exposing a portion of the second doping type semiconductor layer and a second opening is formed on the passivation layer exposing the contact on the first substrate. An electrode layer is formed on the passivation layer covering the first opening and the second opening.

In some implementations, the ion-implanted material is formed in the second doping type semiconductor layer through implantation to divide the second doping type semiconductor layer into a plurality of LED mesas, and each LED mesa is electrically isolated by the ion-implanted material. In some implementations, an ion material is implanted to a defined region of the semiconductor layer with an implantation depth so that the ion-implanted material does not contact the first doping type semiconductor layer. In some implementations, an ion material is implanted to a defined region of the semiconductor layer with an implantation depth so that the ion-implanted material does not contact the first doping type semiconductor layer and the MQW layer.

In some implementations, the implantation operation is performed with an implantation power between about 10 keV and about 300 keV. In some implementations, the ion material includes hydrogen, helium, nitrogen, oxygen, fluorine, magnesium, silicon, or argon ion.

In some implementations, a driving circuit is formed in the first substrate, the semiconductor layer is formed on a second substrate, the semiconductor layer is bonded onto the first substrate through a bonding layer, and the second substrate is removed.

The foregoing description of the specific implementations can be readily modified and/or adapted for various applications. Therefore, such adaptations and modifications are intended to be within the meaning and range of equivalents of the disclosed implementations, based on the teaching and guidance presented herein.

The breadth and scope of the present disclosure should not be limited by any of the above-described exemplary implementations, but should be defined only in accordance with the following claims and their equivalents.

What is claimed is:

1. A light emitting diode (LED) structure, comprising:
   a substrate;
   a bonding layer formed on the substrate;
   a first doping type semiconductor layer formed on the bonding layer;
   a multiple quantum well (MQW) layer formed on the first doping type semiconductor layer;
   a second doping type semiconductor layer formed on the MQW layer, wherein the second doping type semiconductor layer comprises an isolation material made through implantation;
   a passivation layer formed on the second doping type semiconductor layer; and
   an electrode layer formed on the passivation layer in contact with a portion of the second doping type semiconductor layer through a first opening on the passivation layer,
   wherein the isolation material divides the second doping type semiconductor layer into a plurality of LED mesas.

2. The LED structure of claim 1, wherein the plurality of LED mesas comprise a first LED mesa and a second LED mesa adjacent to the first LED mesa, wherein the MQW layer, the first doping type semiconductor layer and the bonding layer beneath the first LED mesa horizontally extend to the MQW layer, the first doping type semiconductor layer and the bonding layer beneath the second LED mesa.

3. The LED structure of claim 1, wherein the isolation material comprises an ion-implanted material.

4. The LED structure of claim 1, wherein the isolation material is formed in the second doping type semiconductor layer having a depth not penetrating the MQW layer.

5. The LED structure of claim 1, further comprising:
   a plurality of contacts of a driving circuit formed in the substrate, wherein each contact is located at an interspace of adjacent LED mesas.

6. The LED structure of claim 5, wherein the electrode layer electrically connects the second doping type semiconductor layer and the contact through the first opening and a second opening on each contact.

7. The LED structure of claim 6, wherein the second opening is formed in the isolation material, the MQW layer, and the first doping type semiconductor layer.

8. A light emitting diode (LED) structure, comprising:
   a substrate; and
   a plurality of LED units formed on the substrate, each LED unit comprising:

a bonding layer formed on the substrate;

a first doping type semiconductor layer formed on the bonding layer;

a multiple quantum well (MQW) layer formed on the first doping type semiconductor layer; and a second doping type semiconductor layer formed on the MQW layer, wherein the plurality of LED units comprises a first LED unit and a second LED unit adjacent to the first LED unit, wherein the second doping type semiconductor layer of the first LED unit is electrically isolated with the second doping type semiconductor layer of the second LED unit by an ion-implanted material, and the ion-implanted material is formed on the first doping type semiconductor layer, and wherein the MQW layer, the first doping type semiconductor layer and the bonding layer of the first LED unit horizontally extend to the MQW layer, the first doping type semiconductor layer and the bonding layer of the second LED unit.

9. The LED structure of claim 8, wherein the ion-implanted material is formed in the second doping type semiconductor layer and on the MQW layer.

10. The LED structure of claim 8, wherein the ion-implanted material comprises hydrogen, helium, nitrogen, oxygen, fluorine, magnesium, silicon, or argon ion implanted material.

11. The LED structure of claim 8, wherein the ion-implanted material is formed in the second doping type semiconductor layer having a depth not penetrating the MQW layer.

12. The LED structure of claim 8, further comprising:

a passivation layer formed on the second doping type semiconductor layer of the plurality of LED units isolated by the ion-implanted material; and an electrode layer formed on the passivation layer in contact with a portion of the second doping type semiconductor layer of each LED unit through a first opening on the passivation layer of each LED unit.

13. The LED structure of claim 12, the LED structure further comprising:

a plurality of contacts of a driving circuit formed in the substrate, wherein each contact is located at an interspace of adjacent LED units.

14. The LED structure of claim 13, wherein the electrode layer electrically connects the second doping type semiconductor layer of each LED unit and each contact through the first opening of each LED unit and a second opening on each contact.

15. The LED structure of claim 14, wherein the second opening is formed in the ion-implanted material, the MQW layer, and the first doping type semiconductor layer.

* * * * *